(12) United States Patent
Wu et al.

(10) Patent No.: US 8,844,732 B2
(45) Date of Patent: Sep. 30, 2014

(54) CASSETTE TRAY AND CARRIER MODULE

(75) Inventors: Ping-Hung Wu, Taoyuan County (TW); Jye-Hsun Chen, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/566,975

(22) Filed: Aug. 3, 2012

(65) Prior Publication Data

US 2014/0034585 A1 Feb. 6, 2014

(51) Int. Cl.
*B65D 85/57* (2006.01)

(52) U.S. Cl.
USPC ........................................ 211/41.12; 206/707

(58) Field of Classification Search
USPC ........... 211/26, 40, 41.1, 41.12, 41.14, 41.17, 211/41.18; 312/9.1, 9.47, 9.52, 9.53, 9.54, 312/9.55; 206/307.1, 387.14, 454, 456, 206/706, 707, 708, 710, 711, 712, 725, 561, 206/722; 361/796, 802; 134/84, 201, 901; 118/500, 503
See application file for complete search history.

(56) References Cited

U.S. PATENT DOCUMENTS

| | | | | |
|---|---|---|---|---|
| 3,710,900 A | * | 1/1973 | Fink | 206/387.15 |
| 3,938,871 A | * | 2/1976 | Bartholomew | 312/240 |
| 4,155,447 A | * | 5/1979 | Edwards | 206/708 |
| 4,407,411 A | * | 10/1983 | Lowry | 206/387.14 |
| 4,411,481 A | * | 10/1983 | Berkman | 312/9.52 |
| 4,440,458 A | * | 4/1984 | Berkman | 312/9.54 |
| 4,527,222 A | * | 7/1985 | Swingley, Jr. | 361/797 |
| D287,440 S | * | 12/1986 | Taylor | D6/407 |
| 4,696,395 A | * | 9/1987 | Rivoli | 206/454 |
| 4,767,002 A | * | 8/1988 | Malcolm | 206/707 |
| 4,781,423 A | * | 11/1988 | Muenzer et al. | 312/183 |
| 4,782,949 A | * | 11/1988 | Berkman | 206/387.14 |
| 5,558,235 A | * | 9/1996 | Hunt | 211/40 |
| 5,597,216 A | * | 1/1997 | Real et al. | 312/9.54 |
| 5,685,423 A | * | 11/1997 | Hunt | 206/307.1 |
| 5,727,695 A | * | 3/1998 | English, II | 211/40 |
| 5,826,719 A | * | 10/1998 | Chen | 206/373 |
| 5,873,458 A | * | 2/1999 | Kao | 206/308.1 |
| 6,109,437 A | * | 8/2000 | Chao | 206/378 |
| 6,340,086 B1 | * | 1/2002 | McConnaughy et al. | 206/307.1 |
| 6,439,398 B1 | * | 8/2002 | Yang | 211/41.1 |
| 6,606,248 B2 | * | 8/2003 | Matthews | 361/752 |
| D509,982 S | * | 9/2005 | Yang | D6/629 |
| 7,160,514 B2 | * | 1/2007 | Chouinard et al. | 422/563 |
| 7,163,110 B2 | * | 1/2007 | Huang et al. | 211/41.18 |
| 7,815,056 B2 | * | 10/2010 | Coppola et al. | 211/41.14 |
| 2005/0082240 A1 | * | 4/2005 | Ohayon | 211/40 |
| 2006/0006095 A1 | * | 1/2006 | White, Jr. | 206/711 |
| 2008/0257779 A1 | * | 10/2008 | Kurikawa | 206/707 |

* cited by examiner

*Primary Examiner* — Joshua Rodden

(57) ABSTRACT

A cassette tray is provided, which includes a bottom plate and two holding members. The bottom plate includes a plurality of positioning holes, wherein the positioning holes are arranged in rows along a first direction, and the rows are spaced apart from each other in a second direction perpendicular to the first direction. Each of the holding members is selectively connected to the positioning holes in one of the rows and mounted on the bottom plate in a detachable manner, and a circuit board is received between the two holding members.

6 Claims, 5 Drawing Sheets

CASSETTE TRAY AND CARRIER MODULE

BACKGROUND OF THE INVENTION

1. Field of the Invention

The present invention relates to a cassette tray and a carrier module, and in particular relates to a cassette tray and a carrier module which are used to receive a circuit board.

2. Description of the Related Art

Currently, various carrier modules which are used to facilitate the transportation of circuit boards have been developed. Prior to the transportation of the circuit boards, the circuit boards are automatically or manually placed on a cassette tray of the carrier module. Next, the cassette tray and the circuit boards are moved to a transporting tray which is disposed on a moving mechanism (e.g. a trail) and moved by the moving mechanism.

The circuit board with more than one memory unit is commonly referred to as a DIMM (dual in-line memory module), and two types of circuit boards, a long DIMM and short DIMM, can be further defined according to the dimensions of the circuit boards. To transport these two types of circuit boards, at least two different cassette trays with two specifications should be provided. However, in order to simultaneously receive long DIMMs and short DIMMs when manufacturing a large number of circuit boards, a corresponding number of the two different cassette trays should be provided. This leads to a large amount of excess inventory and causes increased manufacturing cost.

Meanwhile, because a conventional robot cannot operate with high accuracy, a plurality of compartments is formed between each of two passages to ensure that the circuit boards are placed on the cassette tray correctly. Meanwhile, when the circuit boards are placed on the cassette tray manually, the circuit boards may be hit by the compartments easily. Moreover, the width of the passages for receiving the circuit boards is too large to keep the circuit board straight. Thus, an abnormal tilted angle of the circuit board may occur, which may affect the accuracy of the robot and cause the circuit boards to not be able to be held properly. Therefore, these issues should be resolved by developing a better cassette tray and carrier module.

BRIEF SUMMARY OF THE INVENTION

One of the objectives of the invention is to provide an adjustable cassette tray to receive circuit boards with different dimensions. The other objectivity of the invention is to modify structural features of passages of the cassette tray so as to enhance the operation reliability of the circuit board removal and placement process.

According to one of the embodiments of the present disclosure, a cassette tray includes a bottom plate and two holding members. The bottom plate includes a plurality of positioning holes, wherein the positioning holes are arranged in rows along a first direction, and the rows are spaced apart from each other in a second direction perpendicular to the first direction. Each of the holding members is selectively connected to the positioning holes in one of the rows and mounted on the bottom plate in a detachable manner, and the circuit board is received between the two holding members.

In another embodiment, the positioning holes along the first direction are arranged in a first row, a second row, a third row, and a fourth row, and the first, second, third, and fourth rows are sequentially arranged along the second direction. The two holding members are respectively connected to the positioning holes in the first and fourth rows. Alternatively, the two holding members are respectively connected to the positioning holes in the second and third rows.

In still another embodiment, the cassette tray further includes a lateral side connected to the bottom plate, and the positioning holes in the first row are closer to the lateral side than the other positioning holes in the second, third, and fourth rows, wherein a gap is formed between the lateral side and the holding member which is connected to the positioning holes in the first row.

In another embodiment, each of the two holding members includes a base plate and a plurality of obstruction members. The base plate includes a plurality of first slots. The obstruction members are disposed on the base plate, wherein each of the obstruction members includes a second slot connected to one of the first slots, wherein a plurality of passages are respectively defined by one of the first slots and the corresponding second slot.

In another embodiment, three sloped surfaces are formed on tops of each of the obstruction members, and each of the second slots includes three obstruction surfaces, and each of the three sloped surfaces are connected to each of the three obstruction surfaces of the corresponding obstruction member. Each of the passages is 1.4 mm in width and 8 mm in height, to prevent the circuit board from being tilted.

According to the other embodiments of the present disclosure, a carrier module includes a transporting tray and the above mentioned cassette tray. The transporting tray includes a foolproof structure formed at an intersection of two adjacent lateral sides of the transporting tray, and the cassette tray includes an abutting member formed at an intersection of two adjacent lateral sides of the cassette tray, wherein when the transporting tray is disposed on the cassette tray, the abutting member faces the foolproof structure.

By changing the position of the holding members, the cassette tray can be used to receive circuit boards with different dimensions. Moreover, the modified structural features of the holding members make the process of removing or placing the circuit boards easier.

BRIEF DESCRIPTION OF THE DRAWINGS

The present invention is more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
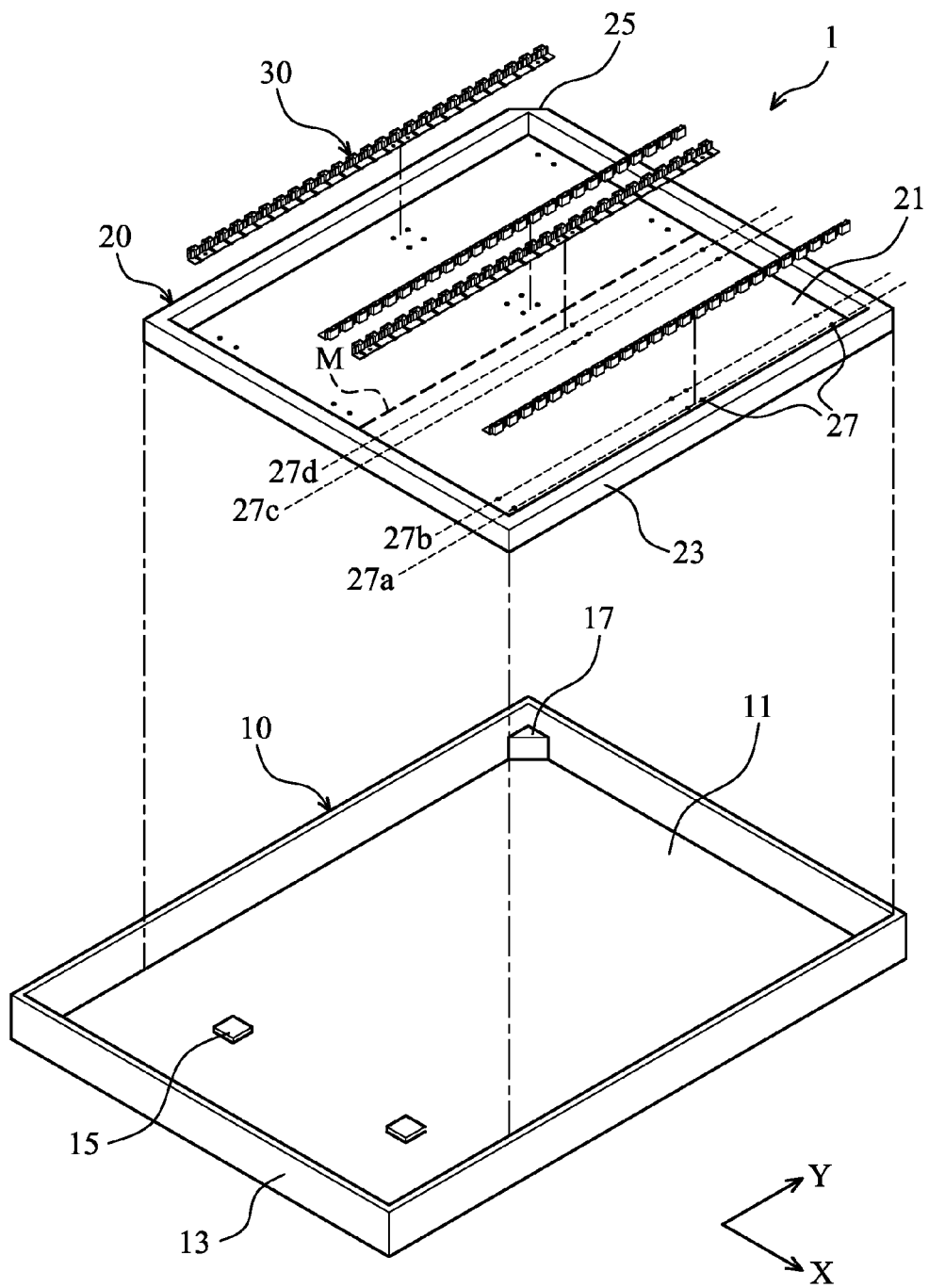
FIG. 1 shows an explosive view of a carrier module in accordance with a preferred embodiment of the present disclosure.

Referring to FIG. 1, a carrier module 1 of a preferred embodiment of present disclosure includes a transporting tray 10, a cassette tray 20, and mechanism (not shown in the figure) for transporting the transporting tray 10. The transporting tray 10 includes two embosses 15 and a foolproof structure 17. The two embosses 15 are respectively disposed on the bottom plate 11 of the transporting tray 10. The foolproof structure 17 is formed at an intersection of two adjacent lateral sides 13 of the transporting tray 10. The function of the embosses 15 and the foolproof structure 17 will be elaborated below.

The cassette tray 20 includes a bottom plate 21, a plurality of lateral sides 23, an abutting member 25, and a plurality of holding members 30. The bottom plate 20 is divided into two regions by a dividing line M, wherein each of the two regions of the bottom plate 20 includes a plurality of positioning holes 27. The positioning holes 27 are arranged in rows along a first direction (Y-axis), and the rows are spaced apart from each other in a second direction (X-axis) perpendicular to the first direction (Y-axis). Specifically, the positioning holes 27 along the first direction (Y-axis) are arranged in a first row 27a, a second row 27b, a third row 27c, and a fourth row 27d, and the first, second, third, and fourth rows 27a-27d are sequentially arranged along the second direction (X-axis). Thus, as shown in FIG. 1, the positioning holes 27 in the first row 27a are closest to the lateral side 23 in the second direction (X-axis) while compared with the other positioning holes 27 in the second, third, and fourth rows 27b-27d. The abutting member 25, corresponding to the foolproof structure 17, is formed at an intersection of two adjacent lateral sides 23 of the cassette tray 20.

Figure 2:
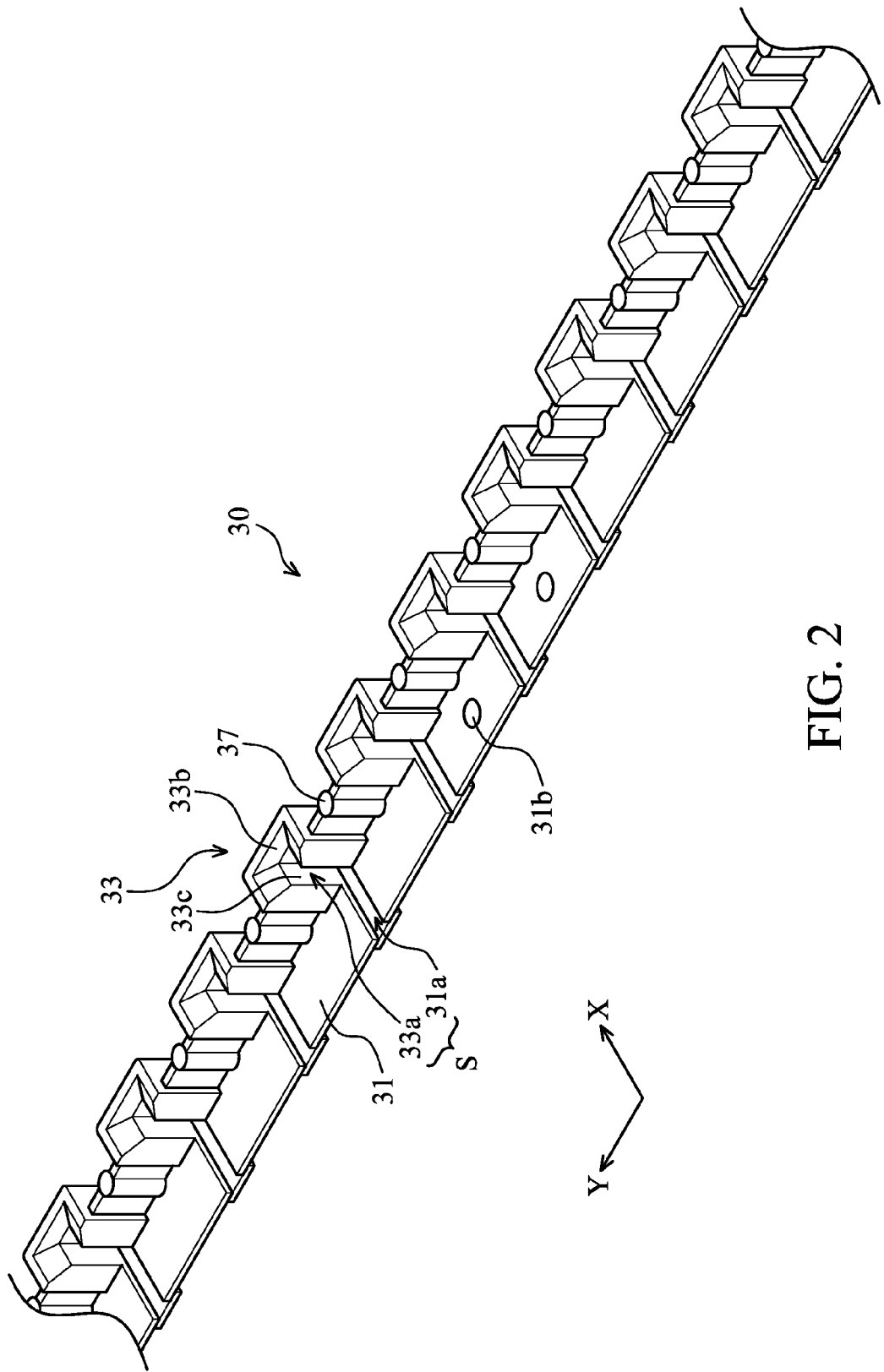
FIG. 2 shows a partial perspective view of a holding member of the carrier module in accordance with the preferred embodiment of the present disclosure.

Referring to FIG. 2, each of the holding members 30 includes a base plate 31, a plurality of obstruction members 33, and a plurality of connecting members 37. The base plate 31 includes a plurality of first slots 31a and a plurality of through holes 31b, wherein each of the first slots 31a extends along the second direction (X-axis), and each of the through holes 31b is configured to receive a positioning member (not shown in the figures). The obstruction members 33 are disposed on the base plate 31 and each two obstruction members 33 are connected by the connecting member 37. The obstruction members 33 respectively include a second slot 33a and three sloped surfaces 33b on its top. The second slots 33a of each of the obstruction members 33 are respectively connected to one of the first slots 31a, and each of the second slots 33a has three obstruction surfaces 33c, respectively connected to the three sloped surfaces 33b. Thus, a plurality of passages S with L-shaped are defined by one of the first slots 31a and one of the corresponding second slots 33a.

Figure 3:
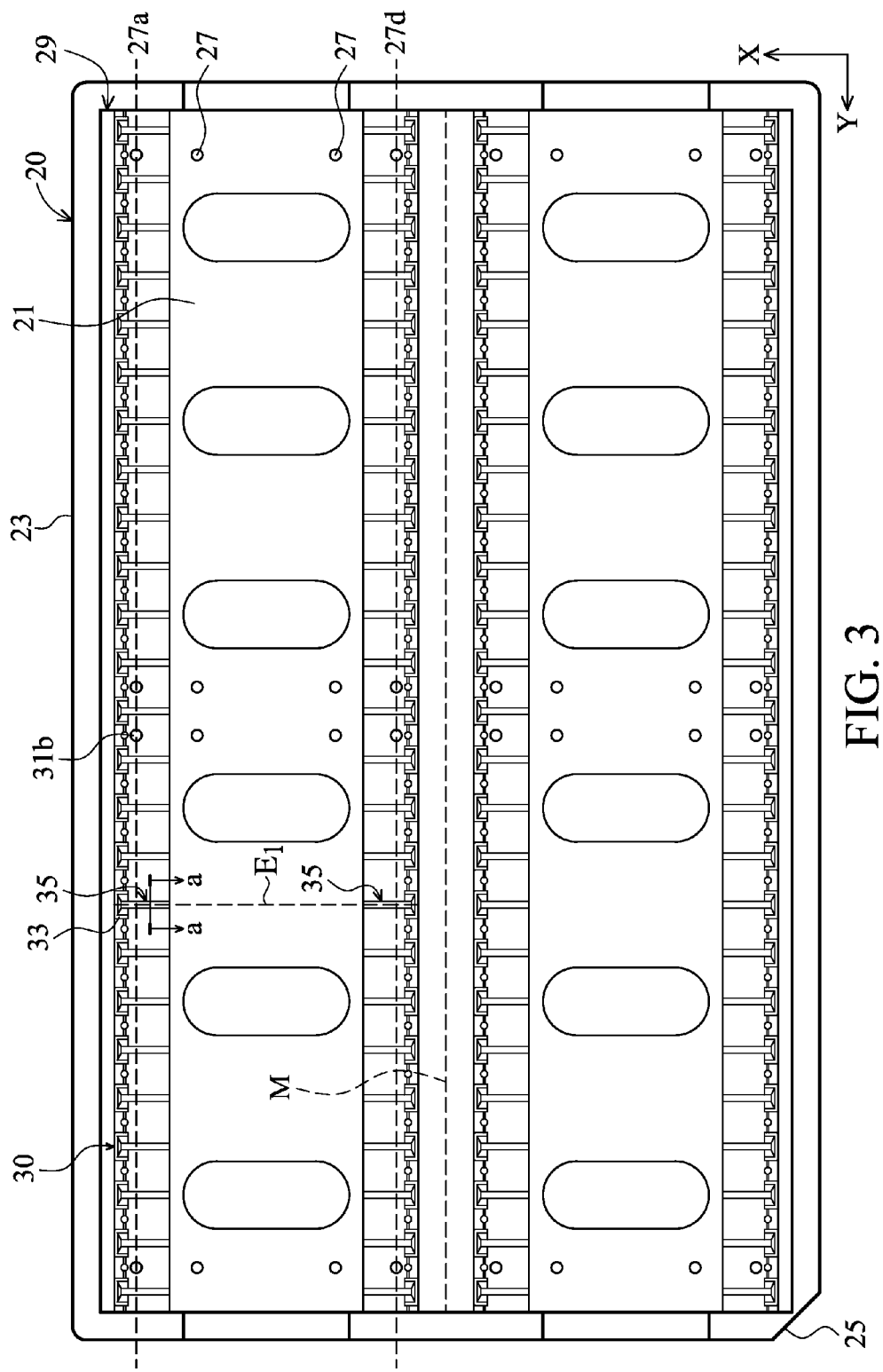
FIG. 3 shows a top view of the carrier module in accordance with a preferred embodiment of the present disclosure, while a cassette tray is used to receive a long DIMM $E_1$.

Referring to FIG. 3, when the cassette tray 20 is used to receive a long DIMM $E_1$, the through holes 31b of the two holding members 30 respectively correspond to the positioning holes 27 in the first and fourth rows 27a and 27d, and the two holding members 30 are connected to the bottom plate 21 via positioning members (not shown in the figures). When inserting the long DIMM $E_1$, two opposite sides of the long DIMM $E_1$ are guided by the sloped surface 33b (FIG. 2) and then received between two passages S of the two holding members 30 facing each other.

Note that, as shown in FIG. 3, a gap 29 is formed between the lateral side 23 and one of the holding members 30 which is connected to the positioning holes 27 in the first row 27a. Due to the features mentioned above, the robot, used to hold the circuit boards $E_1$, is able to insert into a position near the bottom plate 21 of the cassette tray 20 so as to hold a relatively large portion of the circuit boards $E_1$, such that the circuit boards $E_1$ can be held stably. Meanwhile, with the improvement of the alignment precision of the robot, the circuit boards can be accurately disposed into the passages S; thus, the compartments formed between the passages of conventional cassette trays can be removed.

Figure 4:
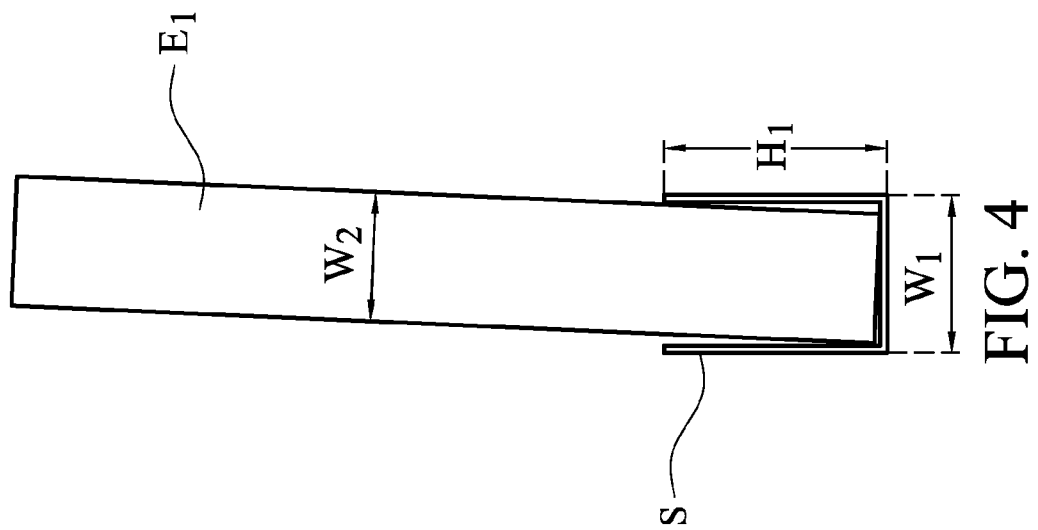
FIG. 4 shows a cross-sectional view taken along a-a line in FIG. 3, wherein the long DIMM $E_1$ is placed in a passage of the cassette tray.

As shown in FIG. 4, the long DIMMs $E_1$ is disposed within the slot S in a slightly tilted manner, wherein the tilted angle between the long DIMM $E_1$ and the bottom surface of the passages S is substantially equal to 90 degrees. For example, in one embodiment, the passage S is 1.4 mm in width $W_1$ and 8 mm in height $H_1$, and the long DIMMs $E_1$ is 1.27 mm in width $W_2$, and the tilted angle of the long DIMM $E_1$ is 89.07 degrees.

Figure 5:
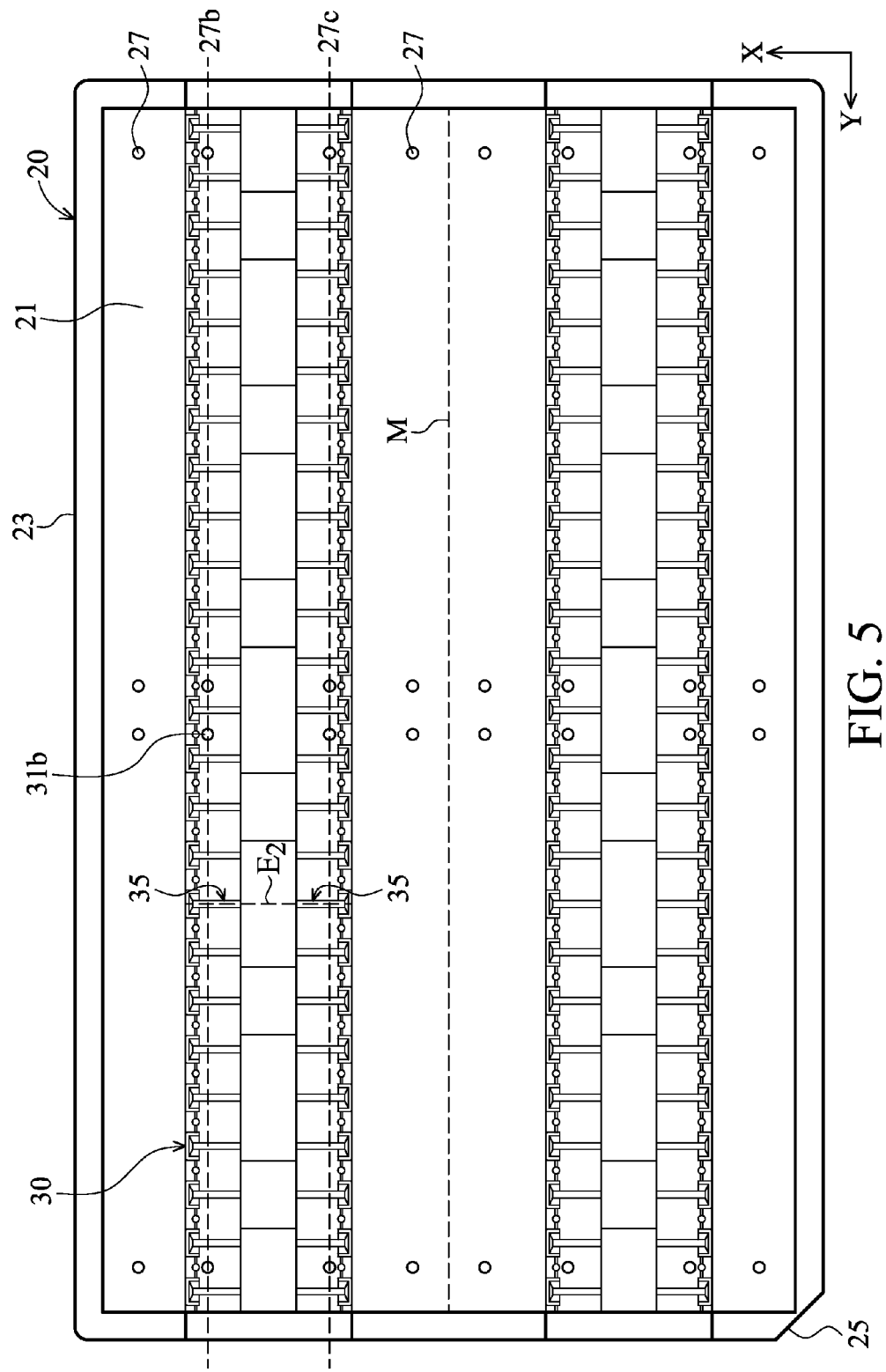
FIG. 5 shows a top view of the carrier module in accordance with a preferred embodiment of the present disclosure, when the cassette tray is used to receive a short DIMMs $E_2$.

Referring to FIG. 5, when the cassette tray 20 is used to load a short DIMM $E_2$, the through holes 31b of the two holding members 30 respectively connect to the positioning holes 27 in the second and third rows 27b and 27c, and the two holding members 30 are connected to the bottom plate 21 via positioning members (not shown in figures). When inserting the short DIMM $E_2$, two opposite sides of the short DIMM $E_2$ are guided by the sloped surface 33b (FIG. 2) and then received between two passages S of the two holding members 30 facing each other in the second direction (X-axis).

Referring to FIG. 1, a method for assembling the cassette tray 20 on the transporting tray 10 is described below. If the cassette tray 20 is disposed on the transporting tray 10 correctly, the abutting member 25 of the cassette tray 20 will face the foolproof structure 17, and one of the lateral sides of the cassette tray 20 will abut the two embosses 15. On the contrary, if the cassette tray 20 is disposed on the transporting tray 10 in a wrong direction, the cassette tray 20 is not allowed to be completely mounted on the transporting tray 10 due to the arrangement of the foolproof structure 17.

In the embodiment, the two regions of the bottom plate divided by the dividing line M have the same configuration, so the features of the other region will not be elaborated for simplification. However, it is noted that the holding members 30 mounted at opposite sides of the dividing line M may be used to receive long DIMMs $E_1$ (FIG. 2) and short DIMMs $E_2$, respectively. Alternatively, in other embodiments, the positioning holes 27 on the two regions can be arranged in different configurations, such that the cassette tray 20 can be used to receive circuit boards with different dimensions not limited to the long DIMMs $E_1$ or short DIMMs $E_2$.

The holding members of the cassette tray of the invention can be adjusted according to the dimensions of the circuit boards which are going to be received therein, so that a single cassette tray is capable of receiving circuit boards with different dimensions. Additionally, through the structural features of the holding members, the operation reliability of the circuit board removal and placement process is further enhanced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A cassette tray for receiving a circuit board, comprising:
   a bottom plate, comprising a plurality of positioning holes, wherein the positioning holes are arranged in a first row, a second row, a third row, and a fourth row-along a first direction, and the first, second, third, and fourth rows are spaced apart from each other and sequentially arranged in a second direction perpendicular to the first direction; and two holding members, wherein each of the holding members extends along the first direction, and each of the holding members is selectively connected to the positioning holes in one of the first, second, third, and fourth rows and mounted on the bottom plate in a detachable manner, so that the two holding members are capable of receiving the circuit board, wherein the two holding members are respectively connected to the positioning holes in the first and fourth rows, or the two holding members are respectively connected to the positioning holes in the second and third rows, wherein one of the positioning holes in the first or fourth row that connects to one of the two holding members and one of the positioning holes in the second or third row that connects to the other holding member are aligned parallel to the second direction, wherein each of the two holding members comprises:
  a base plate, comprising a plurality of first slots; and
  a plurality of obstruction members, disposed on the base plate, wherein each of the obstruction members comprises a second slot connected to one of the first slots, wherein a plurality of passages are each respectively defined by one of the first slots and one of the corresponding second slots.

2. The cassette tray as claimed in claim 1, further comprising a lateral side, and the positioning holes in the first row are closer to the lateral side than the positioning holes in the second, third, and fourth rows, wherein a gap is formed between the lateral side and the holding member when the holding member is connected to the positioning holes in the first row.

3. The cassette tray as claimed in claim 1, wherein three sloped surfaces are formed on tops of each of the obstruction members, and each of the second slots comprises three obstruction surfaces connected to the three sloped surfaces.

4. The cassette tray as claimed in claim 1, wherein each of the passages is 1.4 mm in width and 8 mm in height.

5. A carrier module, comprising:
  a transporting tray; and
  the cassette tray as claimed in claim 1, wherein the cassette tray is capable of being disposed on the transporting tray.

6. The carrier module as claimed in claim 5, wherein the transporting tray comprises a structure formed at an intersection of two adjacent lateral sides of the transporting tray, and the cassette tray comprises an abutting member formed at an intersection of two adjacent lateral sides of the cassette tray, wherein when the cassette tray is disposed on the transporting tray, the abutting member faces the structure.

* * * * *